(12) United States Patent
Busta et al.

(10) Patent No.: US 9,779,792 B2
(45) Date of Patent: Oct. 3, 2017

(54) REGISTER FILE WITH READ PORTS CLUSTERED BY ENTRY

(71) Applicant: Advanced Micro Devices, Inc., Sunnyvale, CA (US)

(72) Inventors: Eric W. Busta, Windsor, CO (US); Karthik Natarajan, Austin, TX (US); Brian M. Lay, Boulder, CO (US); Gregory A. Constant, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 794 days.

(21) Appl. No.: 13/929,040

(22) Filed: Jun. 27, 2013

(65) Prior Publication Data
US 2015/0006810 A1 Jan. 1, 2015

(51) Int. Cl.
| | |
|---|---|
| *G06F 12/00* | (2006.01) |
| *G06F 13/00* | (2006.01) |
| *G06F 13/28* | (2006.01) |
| *G11C 8/16* | (2006.01) |
| *G06F 9/30* | (2006.01) |
| *G11C 7/10* | (2006.01) |

(52) U.S. Cl.
CPC .............. *G11C 8/16* (2013.01); *G06F 9/3012* (2013.01); *G11C 7/1075* (2013.01); *G11C 2207/007* (2013.01)

(58) Field of Classification Search
CPC ... G11C 8/16; G11C 7/1075; G11C 2207/007; G06F 9/2012; G06F 9/3012
USPC ................................ 711/1, 110; 712/E9.027
See application file for complete search history.

(56) References Cited

U.S. PATENT DOCUMENTS

| | | | | |
|---|---|---|---|---|
| 2004/0133766 | A1* | 7/2004 | Abraham | G06F 9/30127 712/217 |
| 2004/0139271 | A1* | 7/2004 | Khellah | G06F 9/30141 711/1 |
| 2007/0041250 | A1* | 2/2007 | Goel | G11C 7/12 365/189.14 |
| 2012/0110269 | A1* | 5/2012 | Frank | G06F 9/30047 711/137 |
| 2014/0208156 | A1* | 7/2014 | Muralimanohar | G11C 8/12 714/6.24 |

OTHER PUBLICATIONS

Rajesh Kumar et al., "A Family of 45nm IA Processors", ISSCC 2009 Session 3 Mircroprocessor Technologies 3.2, 2009 IEEE International Solid-State Circuits Conference, Feb. 8, 2009, 2 pages.

* cited by examiner

*Primary Examiner* — Tuan Thai
*Assistant Examiner* — Shane Woolwine

(57) ABSTRACT

A register file includes a substrate, a plurality of entries, and a plurality of read ports. Each entry includes a corresponding subset of a plurality of memory cells defined on the substrate. Each read port includes a plurality of access elements defined on the substrate. Each access element is associated with a particular common bit position of each of the entries. A plurality of entry access groups are disposed in adjacent columns on the substrate. Each entry access group is associated with a corresponding one of the plurality of entries and includes the access elements for all of the read ports for the corresponding entry.

20 Claims, 5 Drawing Sheets

US 9,779,792 B2

REGISTER FILE WITH READ PORTS CLUSTERED BY ENTRY

BACKGROUND

Field of the Disclosure

The present disclosure generally relates to processors, and more particularly, to a register file for storing data in a processor.

Description of the Related Art

Processors employ various structures to store data for use during processing activities. One type of data structure is a register file. A register file stores a plurality of entries and allows multiple entries to be written to or read from in parallel. An entry is composed of multiple memory cells, one for each bit of the entry. The bits of the collective entries are divided into bit slices, where the same bit of each of the entries in a bit slice is accessed by the same logic structure that acts as a multiplexer to select one bit from one entry. For example, an M-entry bit slice accesses a particular bit for M entries (e.g., bit 5 for all M entries). The M-entry bit slice is replicated to cover all of the N bits. So for a register file with N bits per entry, N M-entry bit slices would be provided. The collection of M-entry bit slices spanning N bits may also be replicated to increase the number of entries in the register file.

Entries in the register file are accessed by read ports and write ports. A read port includes logic that is coupled to each entry of an M-entry bit slice to select a given bit of one of the entries. To support parallel read accesses multiple read ports are provided. Conventional register file layouts position the write ports and the read ports at each memory cell. This distributed approach results in relatively long bit lines. One conventional approach seeking to increase density clusters the read ports instead of distributing them to each memory cell. This approach shortens the bit lines, however, the resulting layout requires a large number of interconnections routed in close proximity to one another to the clustered read ports. Increasing the number of read ports complicates the process of routing the interconnections.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-5 illustrate a register file for use in a computing system where the read port logic in the register file is grouped by entry. Access elements to select memory cells storing the data for a given entry of the register file are grouped in columns, and read ports are grouped into rows spanning the columns. Grouping the access elements by entry simplifies the routing of the data lines thereby increasing area efficiency and facilitating implementation of a greater number of read ports.

Figure 1:
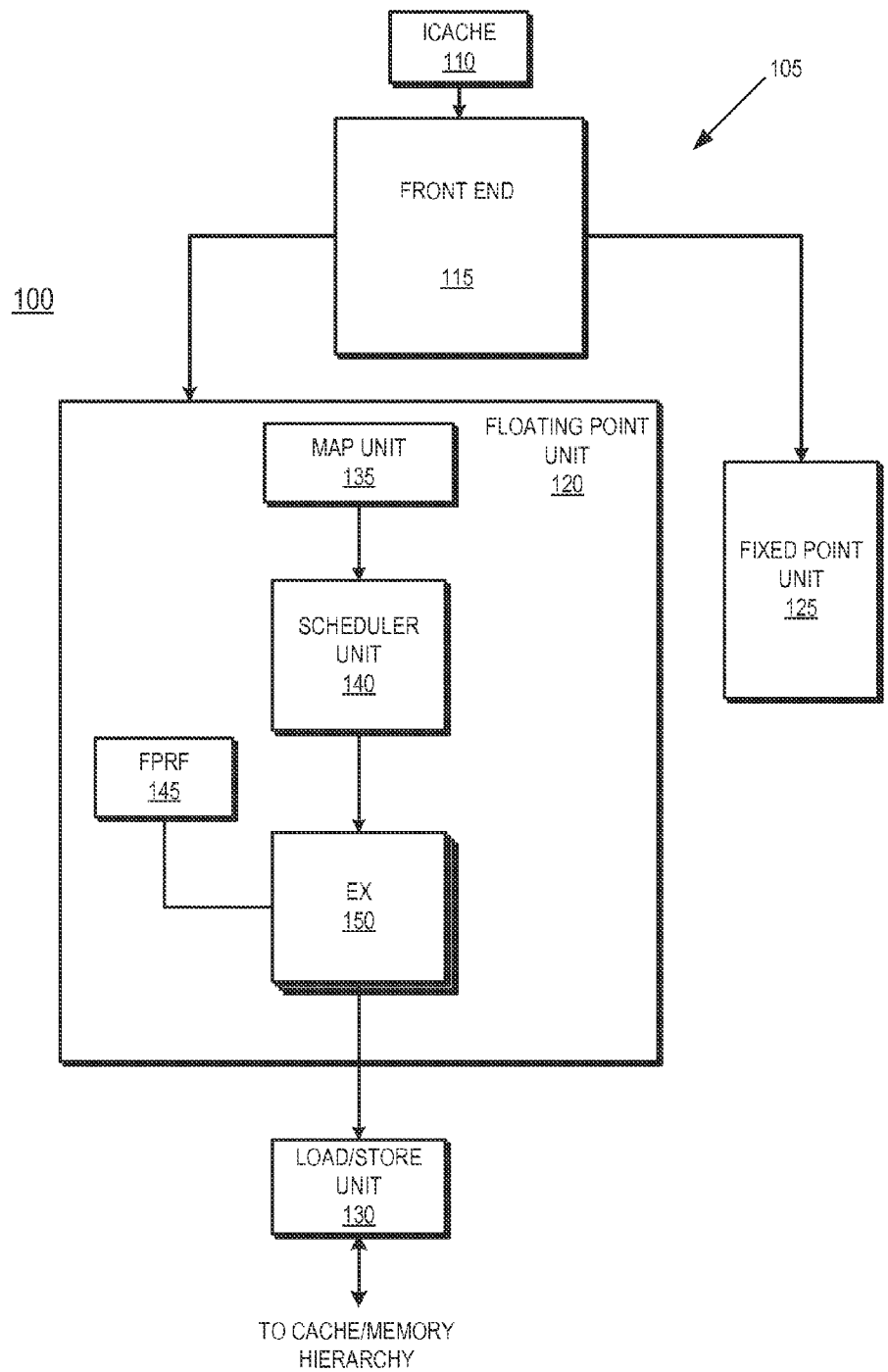
FIG. 1 is a block diagram of a processor core in accordance with some embodiments.

FIG. 1 illustrates a processor core 100 of a processor having an execution pipeline 105 in accordance with some embodiments. The illustrated processor core 100 can include, for example, a central processing unit (CPU) core based on an x86 instruction set architecture (ISA), an ARM ISA, and the like. The processor can implement a plurality of such processor cores, and the processor can be implemented in any of a variety of electronic devices, such as a notebook computer, desktop computer, tablet computer, server, computing-enabled cellular phone, personal digital assistant (PDA), set-top box, game console, and the like.

In the depicted example, the execution pipeline 105 includes an instruction cache 110 ("Icache"), a front end 115, one or more floating point units 120, and one or more fixed point units 125 (also commonly referred to as "integer execution units"). The processor core 100 also includes a load/store unit (LSU) 130 connected to a memory hierarchy (not shown), including one or more levels of cache (e.g., L1 cache, L2, cache, etc.), a system memory, such as system RAM, and one or more mass storage devices, such as a solid-state drive (SSD) or an optical drive.

The instruction cache 110 stores instruction data that is fetched by a fetch unit (not shown) of the front end 115 in response to demand fetch operations (e.g., a fetch to request the next instruction in the instruction stream identified by the program counter) or in response to speculative prefetch operations. The front end 115 decodes instructions fetched by the fetch unit into one or more operations that are to be performed, or executed, by either the floating point unit 120 or the fixed point unit 125. Those operations involving floating point calculations are dispatched to the floating point unit 120 for execution, whereas operations involving fixed point calculations are dispatched to the fixed point unit 125.

The floating point unit 125 includes a map unit 135, a scheduler unit 140, a floating point register file (FPRF) 145, and one or more execution (EX) units 150. The FPRF 145 stores a set of physical registers, each of which is associated with a different physical register name (PRN). For convenience, as used herein the PRN can refer to the name of the physical register, and can refer to the physical register that has that name. Thus, for example, "storing data at a PRN" indicates that the data is stored at the physical register identified by the PRN. As described in greater detail below, the FPRF 145 includes read ports having access elements grouped by entry. This arrangement allows more efficient interconnection routing and facilitates an increase in the number of read ports.

In an operation of the floating point unit 120, the map unit 135 receives operations from the front end 115 (usually in the form of operation codes, or opcodes). These dispatched operations typically also include, or reference, operands used in the performance of the represented operation, such as a memory address at which operand data is stored, an architected register at which operand data is stored, one or more constant values (also called "immediate values"), and the like. The map unit 135 and the scheduler unit 140 control the selective distribution of operations among the EX units 150. Typically, a queue entry maintained by the scheduler unit 140 includes a field to store the operation payload or operation identifier (e.g., the opcode for the operation), fields for the addresses or other identifiers of physical registers that contain the source operand(s) for the operation, fields to store any immediate or displacement values to be used with the operation, a destination field that identifies the physical register in which the result of the execution of the corresponding operation is to be stored, and at least one field to store instruction dependency information. For example, a load instruction includes address information indicating the target of the load instruction and an architected register operand indicating the PRN in the FPRF 145 that receives the data from the target address.

The operations performed by the EX units 150 typically utilize operand data, in the form of one or both of operands stored in source registers immediate/displacement values. The immediate/displacement value used during execution operation is dispatched to the EX unit 150 along with the operation from the scheduler unit 140. The source operands stored in the physical registers are read from the FPRF 145 and provided to the corresponding EX unit 150 for use in executing the operation. Typically, these source operands are obtained by initiating a read to the FPRF 145.

Although the following description is related to a register file implemented in the floating point unit 120, it applies to any type of register file that may be implemented for the fixed point unit 125, or an entirely different type of processing unit, such as a digital signal processor, a graphics processor, an application specific integrated circuit (ASIC), etc.

Figure 2:
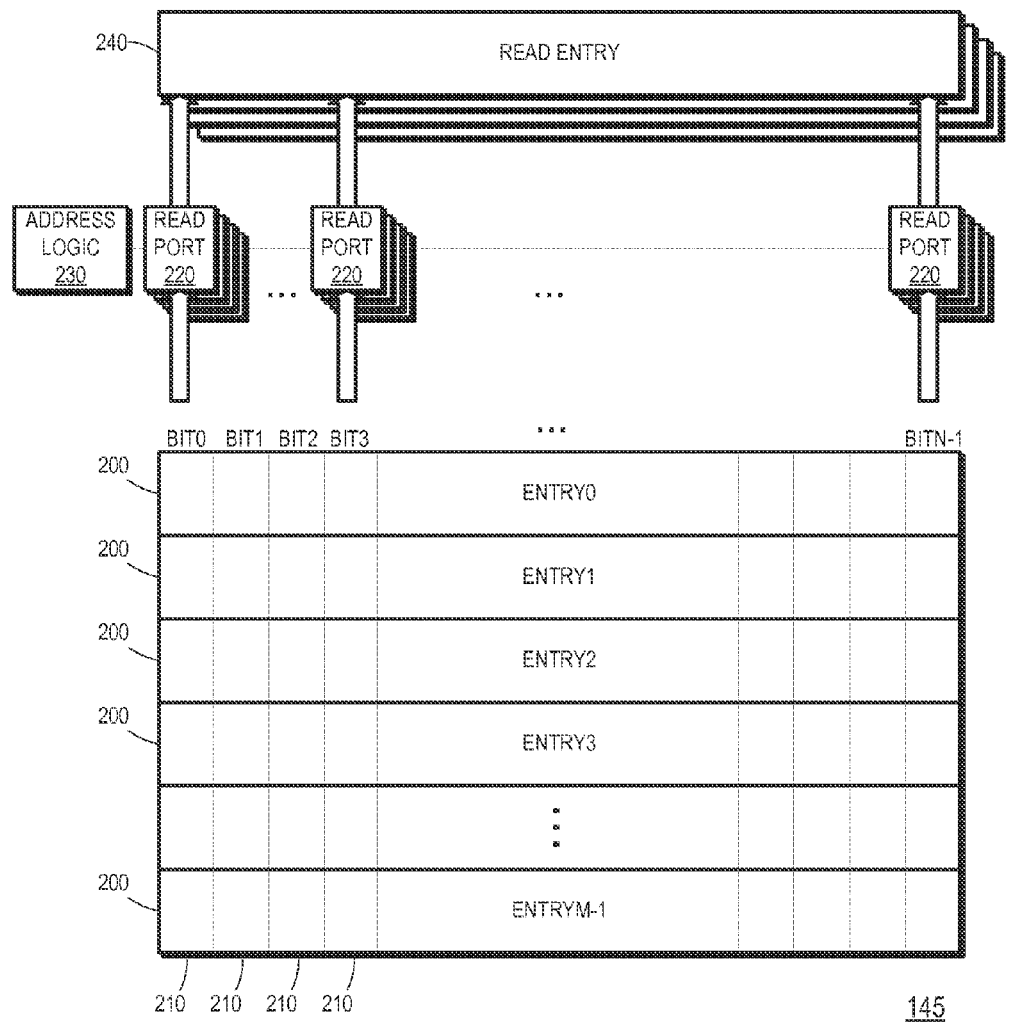
FIG. 2 is a block diagram of a register file in the processor core of FIG. 1 in accordance with some embodiments.

FIG. 2 is a block diagram of the FPRF 145 in accordance with some embodiments. The FPRF 145 includes a plurality of entries 200, denoted as "ENTRY0 . . . ENTRYM−1" where M is the number of entries 200. For read purposes, the entries 200 are read using M-entry bit slices 210, denoted as "BIT0 . . . BITN−1" where N is the number of bits. For purposes of illustration, a single M-entry block is depicted, however, the M-entry block may be replicated to increase the number of entries for the FPRF 145. A bit slice 210 (illustrated as a bit column) accesses a common bit position across all of the entries 200. Each bit slice 210 may be accessed by one of a plurality of read ports 220. Each bit position of the entries 200 has its own bit slice 210 and set of read ports 220. Each read port 220 may access a different entry 200. Address logic 230 controls the read ports 220 to allow a particular entry 200 to be accessed. The outputs of the read ports 220 across all of the bit slices 210 are combined to generate a read entry 240 representing the output from the FPRF 145. Because the read ports 220 for a given bit slice 210 are independent, the FPRF 145 may output multiple entries 240 in parallel. The number of independent read ports 220 per bit slice 210 may vary.

Figure 3:
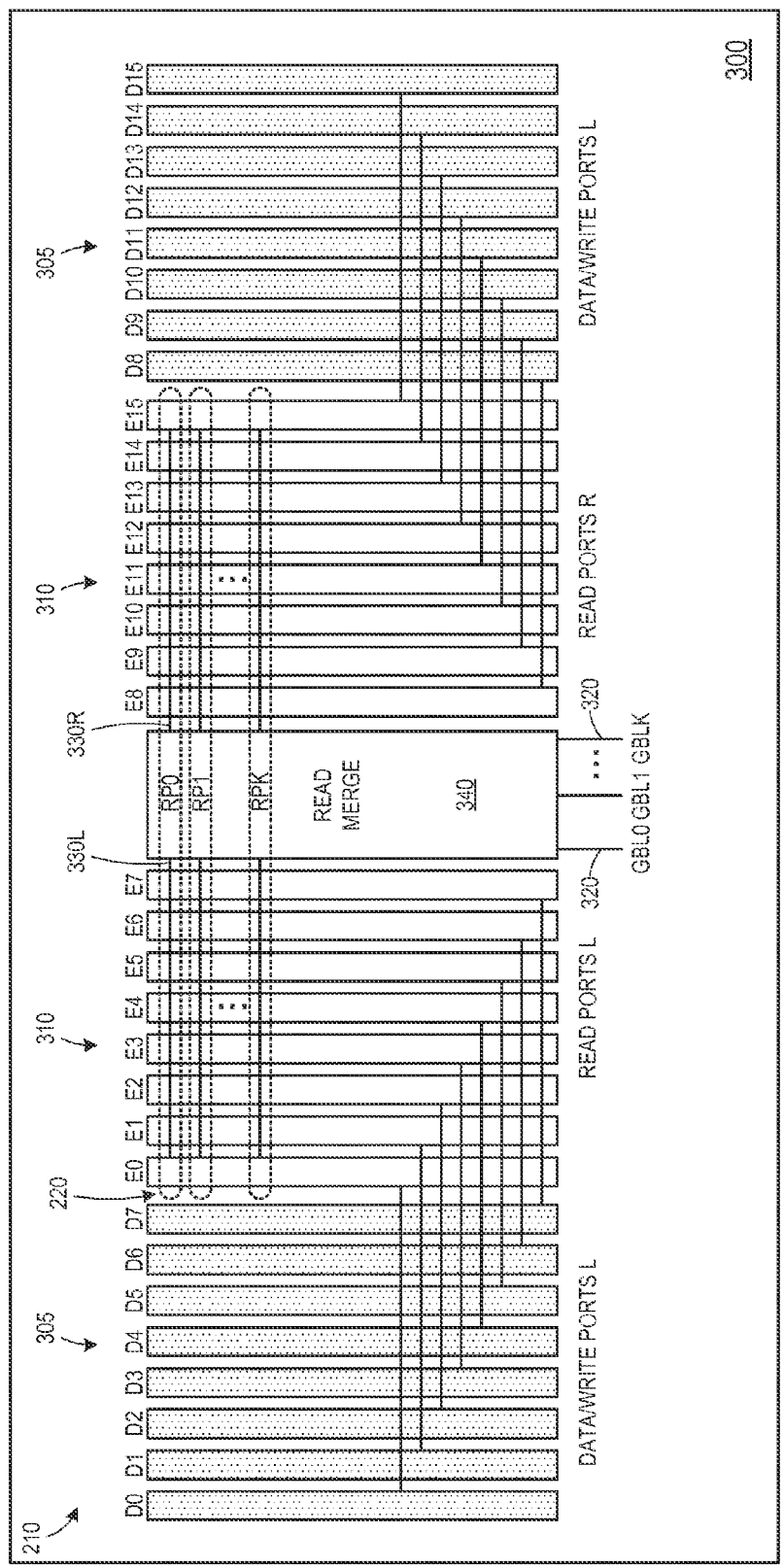
FIG. 3 is a diagram illustrating the physical layout of an M-entry bit slice on a substrate in accordance with some embodiments.

FIG. 3 illustrates the physical layout of an M-entry bit slice 210 on a substrate 300 in accordance with some embodiments. In the illustrated example, the number of entries, M, is 16. The M-entry bit slice 210 includes a plurality of data logic elements 305 (denoted individually as "D0-D15") for writing and storing the data associated with each entry and a plurality of entry access groups 310 (denoted individually as "E0-E15"). Each data logic element 305 stores a bit for one of the entries. Each entry access group 310 includes access logic for each of the plurality of read ports 220 (denoted individually as "RP0-RPK" for K read ports 220). Each read port 220 includes a left local bitline 330L and a right local bitline 330R. Read merge logic 340 disposed between the bitlines 330L, 330R and between adjacent entry access groups E7 and E8 performs a logical OR operation to combine the outputs seen on the local bitlines 330L, 330R to generate a global bitline 320 (denoted individually as "GLB0-GLBK") for each read port 220. As will be described in greater detail below, the access logic in each entry access group 310 is grouped by entry.

Figure 4:
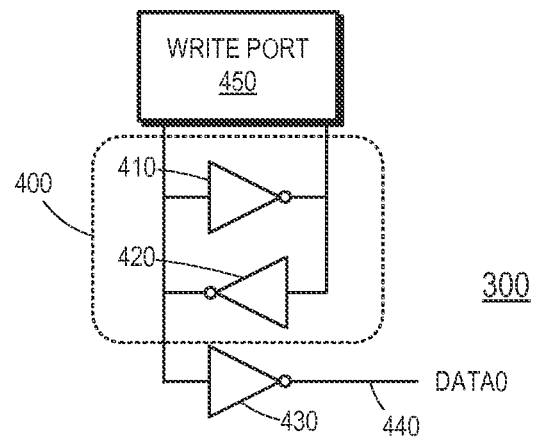
FIG. 4 is a diagram of a data logic element in the bit slice of FIG. 3 in accordance with some embodiments.

FIG. 4 illustrates a diagram of one of the data logic elements 305, such as D0, in accordance with some embodiments. The other data elements D1-D15 have the same structure. The data logic element 305 includes a memory cell 400 defined by cross-coupled inverters 410, 420. An inverter 430 drives the value stored in the memory cell 400 on a data line 440 (e.g. DATA0 for entry 0). A write port 450 is coupled to the memory cell 400 for storing a data value therein. In some embodiments, the type of memory cell may vary from the memory cell 400 illustrated. Any memory topology may be used, such as static or dynamic random access memory, flash memory, etc.

Figure 5:
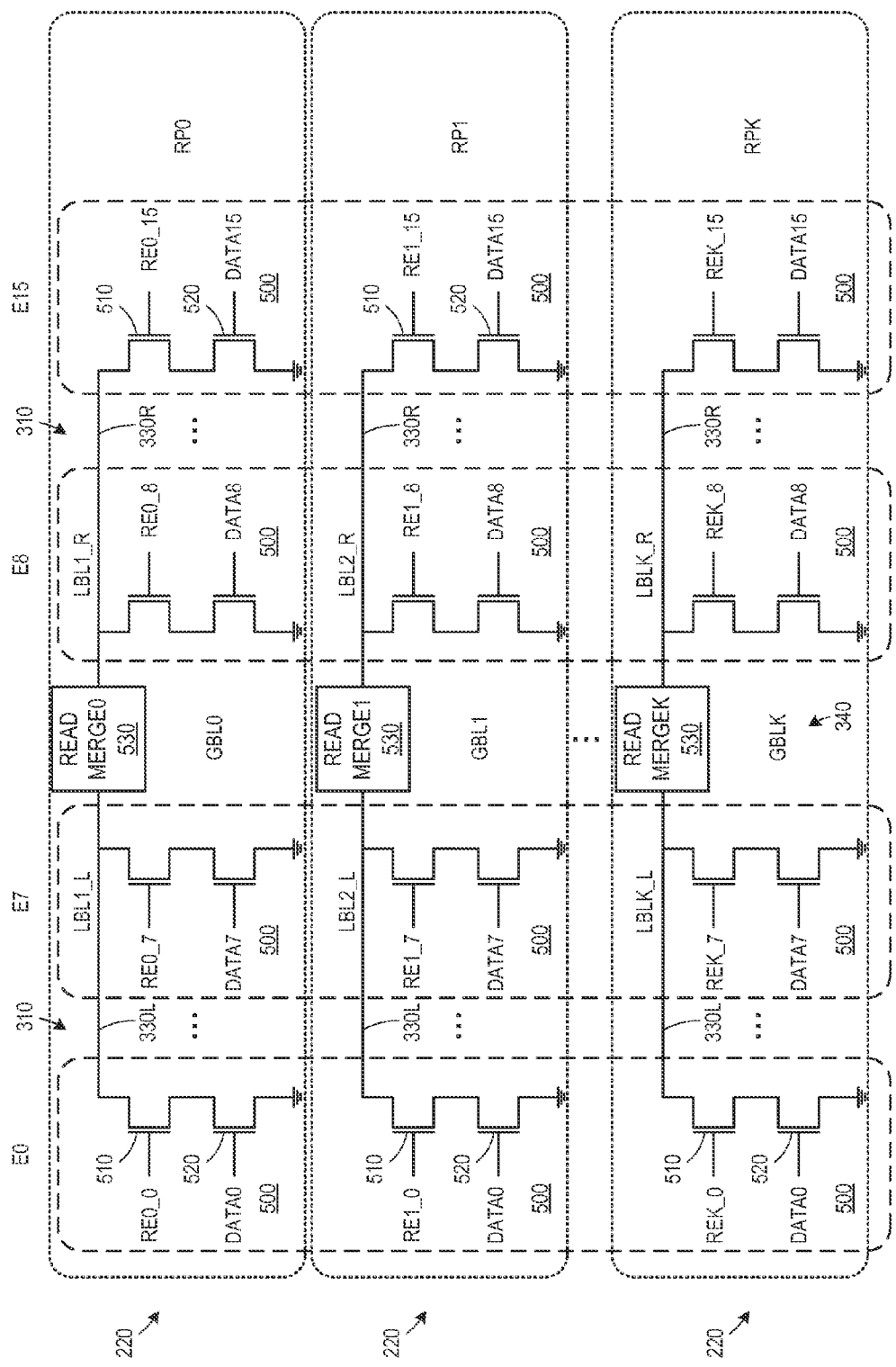
FIG. 5 is a circuit diagram illustrating the physical arrangement of entry access groups and read ports in the bit slice of FIG. 3 in accordance with some embodiments.

FIG. 5 is a circuit diagram illustrating the physical arrangement of the entry access groups 310 and the read ports 220 in accordance with some embodiments. The entry access groups 310 are arranged in columns and the read ports 220 are arranged in rows. The entry access groups 310 include a plurality of access elements 500 for coupling the local bitlines 330L, 330R of the read ports 220 to selected data logic elements 305 (shown in FIG. 3). Each access element 500 includes a select transistor 510 and a pull-down transistor 520. The select transistor 510 includes a control input (gate input) that is enabled by the address logic 230 associated with the read port 220 to select a particular entry 200 from the FPRF 145. The pull-down transistor 520 has a control input that is manipulated by the value present on the data line 440 (see FIG. 4) from the memory cell 400 that indicates the logic state of the memory cell 400. If the memory cell 400 stores a logic "0", the value is inverted by the inverter 430, which enables the pull-down transistor 520 to ground the associated local bitline 330L, R (denoted as "LBL1_L-LBLK_L" for the left bitlines 330L and "LBL1_R-LBLK_R" for the right bitlines 330R). If a logic "1" is stored by the memory cell 400, the pull-down transistor 520 is not enabled and the associated local 330L, 330R remains at its pre-charged level. The FPRF 145 address logic 230 enables the select transistor 510 for only one of the entries to allow the value of the bit for the entry to be read. For example, to select entry E7 for port RP0, the address logic 230 asserts RE0_7 and keeps RE0_1-6 and RE0_8-15 deasserted. The value seen on the local bitline LBL1_L is controlled by the data line 440 for entry 7 (DATA7). The read merge logic 340 includes a read merge unit 530 for each read port 220 to combine the signals seen on the left and right local bitlines 330L, 330R.

Arranging entry access groups 310 in columns on the substrate 300 (see FIG. 3) locates the pull-down transistors 520 in close proximity so that the routing for the data lines 440 is simplified. One data line 440 from the memory cell 400 is routed to the entry access group 310 and then distributed to the pull-down transistors 520 for all of the read ports 220. In this manner, the data lines 440 can share the same routing track to reduce wire congestion. This arrangement also helps area efficiency by making the design limited by the number of devices (i.e., the read ports 220 and their associated access elements 500) instead of by the data line routings. In addition, the address logic 230 that handles the decoding for the read ports 220 is simplified because the lines flow horizontally, which lends itself to having entries (addresses) increase in the horizontal direction.

In some embodiments, at least some of the functionality described above may be implemented by one or more processors executing one or more software programs tangibly stored at a computer readable medium, and whereby the one or more software programs comprise instructions that, when executed, manipulate the one or more processors to perform one or more functions of the processing system described above. Further, in some embodiments, serial data interfaces described above are implemented with one or more integrated circuit (IC) devices (also referred to as integrated circuit chips). Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices on as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but are not limited to, optical media (e.g., compact disc (CD), digital versatile disc (DVD), or Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 6:
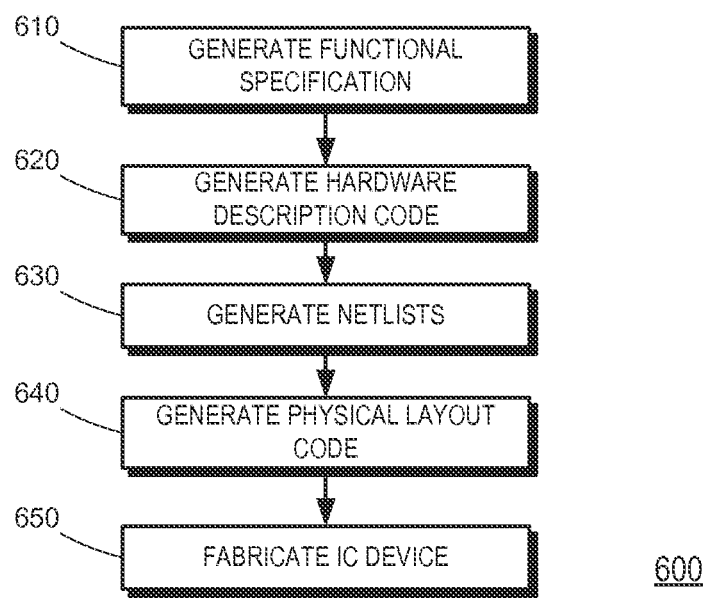
FIG. 6 is a flow diagram illustrating a method for designing and fabricating an integrated circuit device implementing at least a portion of a component of a processor in accordance with some embodiments.

FIG. 6 is a flow diagram illustrating an example method 600 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 602 a functional specification for the IC device is generated. The functional specification (often referred to as a micro architecture specification (MAS)) may be represented by any of a variety of programming languages or modeling languages, including C, C++, SystemC, Simulink, or MATLAB.

At block 604, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL, include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 606 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 608, one or more EDA tools use the netlists produced at block 606 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist (s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 610, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the toots of the manufacturing facility or the manufacturing operations performed therein.

As disclosed herein, in some embodiments a register file includes a substrate, a plurality of entries, and a plurality of read ports. Each entry includes a corresponding subset of a plurality of memory cells defined on the substrate. Each read port includes a plurality of access elements defined on the substrate. Each access element is associated with a particular common bit position of each of the entries. A plurality of entry access groups are disposed in adjacent columns on the substrate. Each entry access group is associated with a corresponding one of the plurality of entries and includes the access elements for all of the read ports for the corresponding entry.

As disclosed herein, in some embodiments a processor defined on a substrate includes a map unit, an execution unit, and a register file. The map unit is to receive an instruction referencing an architectured register name and convert the architectured register name to a physical register name. The execution unit is to execute the instruction using the physical register name. The register file is to store a plurality of entries indexed by the physical register name. The execution unit is to access the register file using the physical register name to retrieve at least one of the entries. The register file includes a plurality of memory cells defined on a substrate and a plurality of read ports. Subsets of the memory cells are grouped to define the entries. Each read port includes a plurality of access elements defined on the substrate. Each access element is associated with a particular common bit position of each of the entries. A plurality of entry access groups are disposed in adjacent columns on the substrate. Each entry access group is associated with a corresponding one of the plurality of entries and includes the access elements for all of the read ports for the corresponding entry.

As disclosed herein, in some embodiments a non-transitory computer readable medium stores code to adapt at least one computer system to perform a portion of a process to fabricate at least part of a register file on a substrate. The register file includes a plurality of entries and a plurality of read ports. Each entry includes a corresponding subset of a plurality of memory cells defined on the substrate. Each read port includes a plurality of access elements defined on the substrate. Each access element is associated with a particular common bit position of each of the entries. A plurality of entry access groups are disposed in adjacent columns on the substrate. Each entry access group is associated with a corresponding one of the plurality of entries and includes the access elements for all of the read ports for the corresponding entry.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A register file, comprising:
  a substrate;
  a plurality of entries, each entry comprising a corresponding subset of a plurality of memory cells defined on the substrate;
  a plurality of read ports, each read port to independently and exclusively access a same single designated bit position in each of the plurality of entries such that each read port accesses only one bit position in each of the plurality of entries, each read port including a plurality of access elements defined on the substrate, each access element being associated with the same single designated bit position of each of the entries; and
  a plurality of entry access groups disposed in adjacent columns on the substrate, each entry access group being associated with a corresponding one of the plurality of entries and including the access elements for all of the read ports for the corresponding entry.

2. The register file of claim 1, wherein the read ports are arranged in rows spanning the columns.

3. The register file of claim 1, wherein each read port includes a bitline coupled to at least a subset of the access elements and spanning at least a subset of the plurality of entry access groups, wherein the access elements in the subset of the access elements each correspond to one of the entry access groups in the subset of the entry access groups.

4. The register file of claim 3, further comprising a data line coupling the memory cell of the entry associated with the corresponding entry access group to the access elements in the corresponding entry access group.

5. The register file of claim 3, wherein each access element comprises:
  a select transistor coupled to the bitline; and
  a pull-down transistor coupled to the select transistor and having a control input coupled to one of the memory cells of the entry associated with the corresponding entry access group.

6. The register file of claim 1, wherein each read port includes:
  a global bitline;
  a first bitline coupled to a first subset of the access elements and spanning at least a first subset of the plurality of entry access groups, wherein the access elements in the first subset of the access elements each correspond to one of the entry access groups in the first subset of the entry access groups;
  a second bitline coupled to a second subset of the access elements and spanning a second subset of the plurality of entry access groups, wherein the access elements in the second subset of the access elements each correspond to one of the entry access groups in the second subset of the entry access groups; and
  read merge logic coupled to the first and second bitlines and operable to combine logical states of signals on the first and second bitlines to generate an output signal on the global bitline.

7. The register file of claim 6, wherein the read merge logic is disposed between the first and second bitlines.

8. The register file of claim 6, wherein the read merge logic is disposed between two adjacent entry access groups.

9. The register file of claim 6, wherein each access element comprises:
  a select transistor coupled to the associated first or second bitline; and
  a pull-down transistor coupled to the select transistor and having a control input coupled to one of the memory cells of the entry associated with the corresponding entry access group.

10. The register file of claim 6, further comprising a data line coupling the memory cell of the entry associated with the corresponding entry access group to the access elements in the corresponding entry access group.

11. A processor defined on a substrate, comprising:
a map unit to receive an instruction referencing an architectured register name and convert the architectured register name to a physical register name;
an execution unit to execute the instruction using the physical register name; and
a register file to store a plurality of entries indexed by the physical register name, wherein the execution unit is to access the register file using the physical register name to retrieve at least one of the entries, the register file comprising:
a plurality of memory cells defined on a substrate, wherein subsets of the memory cells are grouped to define the entries;
a plurality of read ports, each read port to independently and exclusively access a same single designated bit position in each of the plurality of entries such that each read port accesses only one bit position in each of the plurality of entries, each read port including a plurality of access elements defined on the substrate, each access element being associated with the same single designated bit position of each of the entries; and
a plurality of entry access groups disposed in adjacent columns on the substrate, each entry access group being associated with a corresponding one of the plurality of entries and including the access elements for all of the read ports for the corresponding entry.

12. The processor of claim 11, wherein the read ports are arranged in rows spanning the columns.

13. The processor of claim 12, wherein each read port includes a first bitline coupled to a first subset of the access elements and spanning at least a first subset of the plurality of entry access groups, wherein the access elements in the first subset of the access elements each correspond to one of the entry access groups in the first subset of the entry access groups.

14. The processor of claim 13, further comprising a data line coupling the memory cell of the entry associated with the corresponding entry access group to the access elements in the corresponding entry access group.

15. The processor of claim 13, wherein each access element comprises:
a select transistor coupled to the first bitline; and
a pull-down transistor coupled to the select transistor and having a control input coupled to one of the memory cells of the entry associated with the corresponding entry access group.

16. The processor of claim 11, wherein each read port includes:
a global bitline;
a first bitline coupled to a first subset of the access elements and spanning at least a first subset of the plurality of entry access groups, wherein the access elements in the first subset of the access elements each correspond to one of the entry access groups in the first subset of the entry access groups;
a second bitline coupled to a second subset of the access elements and spanning a second subset of the plurality of entry access groups, wherein the access elements in the second subset of the access elements each correspond to one of the entry access groups in the second subset of the entry access groups; and
read merge logic coupled to the first and second bitlines and operable to combine logical states of signals on the first and second bitlines to generate an output signal on the global bitline.

17. The processor of claim 16, wherein the read merge logic is disposed between the two adjacent entry access groups.

18. The processor of claim 16, wherein each access element comprises:
a select transistor coupled to the associated first or second bitline; and
a pull-down transistor coupled to the select transistor and having a control input coupled to one of the memory cells of the entry associated with the corresponding entry access group.

19. The processor of claim 16, further comprising a data line coupling the memory cell of the entry associated with the corresponding entry access group to the access elements in the corresponding entry access group.

20. A non-transitory computer readable medium storing code to adapt at least one computer system to perform a portion of a process to fabricate at least part of an integrated circuit device on a substrate, the device comprising:
a substrate;
a plurality of entries, each entry comprising a corresponding subset of a plurality of memory cells defined on the substrate;
a plurality of read ports, each read port to independently and exclusively access a same single designated bit position in each of the plurality of entries such that each read port accesses only one bit position in each of the plurality of entries, each read port including a plurality of access elements defined on the substrate, each access element being associated with the same single designated bit position of each of the entries; and
a plurality of entry access groups disposed in adjacent columns on the substrate, each entry access group being associated with a corresponding one of the plurality of entries and including the access elements for all of the read ports for the corresponding entry.

* * * * *